United States Patent
Kim et al.

(10) Patent No.: US 11,585,969 B2
(45) Date of Patent: Feb. 21, 2023

(54) OPTICAL FILTERS AND IMAGE SENSORS AND CAMERA MODULES AND ELECTRONIC DEVICES

(71) Applicants: Samsung Electronics Co., Ltd., Suwon-si (KR); Industry-University Cooperation Foundation Korea Aerospace University, Goyang-si (KR)

(72) Inventors: Mi Jeong Kim, Hwaseong-si (KR); Jinyoung Hwang, Goyang-si (KR); Ginam Kim, Seongnam-si (KR); Hye Ran Kim, Hwaseong-si (KR)

(73) Assignees: Samsung Electronics Co., Ltd., Gyeonggi-do (KR); Industry-University Cooperation Foundation Korea Aerospace University, Gyeonggi-do (KR)

( * ) Notice: Subject to any disclaimer, the term of this patent is extended or adjusted under 35 U.S.C. 154(b) by 362 days.

(21) Appl. No.: 16/830,819

(22) Filed: Mar. 26, 2020

(65) Prior Publication Data

US 2021/0003753 A1    Jan. 7, 2021

(30) Foreign Application Priority Data

Jul. 5, 2019    (KR) .................. 10-2019-0081629

(51) Int. Cl.
*G02B 5/20*    (2006.01)
*H01L 27/146*    (2006.01)
*G03B 11/00*    (2021.01)

(52) U.S. Cl.
CPC ........ *G02B 5/208* (2013.01); *H01L 27/14621* (2013.01); *G02B 2207/101* (2013.01); *G03B 11/00* (2013.01)

(58) Field of Classification Search
CPC .. G02B 5/208; G02B 2207/101; G02B 5/008; G02B 5/20; H01L 27/14621; G03B 11/00; H04N 5/225
See application file for complete search history.

(56) References Cited

U.S. PATENT DOCUMENTS

| | | | |
|---|---|---|---|
| 8,655,189 B2 * | 2/2014 | Almassy | G02F 1/19 398/201 |
| 9,900,979 B2 * | 2/2018 | Sohn | H05K 1/09 |
| 10,082,611 B2 | 9/2018 | Shiono et al. | |
| 10,495,796 B2 | 12/2019 | Shiono et al. | |

(Continued)

FOREIGN PATENT DOCUMENTS

| CN | 105572946 A | 5/2016 |
|---|---|---|
| JP | 2007108536 A | 4/2007 |

(Continued)

*Primary Examiner* — Jonathan Han
(74) *Attorney, Agent, or Firm* — Harness, Dickey & Pierce, P.L.C.

(57) ABSTRACT

An optical filter includes a light absorbing layer and a conductive nanodisk. The light absorbing layer includes a near-infrared absorbing material configured to absorb light of a first wavelength spectrum within a near-infrared wavelength spectrum. The conductive nanodisk is configured to absorb or reflect light of a second wavelength spectrum within the first wavelength spectrum. An image sensor includes the optical filter, a camera module includes the optical filter, and an electronic device includes the optical filter.

31 Claims, 15 Drawing Sheets

(56) References Cited

U.S. PATENT DOCUMENTS

| | | |
|---|---|---|
| 2006/0144713 A1 | 7/2006 | Song et al. |
| 2008/0273240 A1 | 11/2008 | Danzebrink et al. |
| 2009/0159858 A1 | 6/2009 | Noguchi et al. |
| 2013/0258456 A1* | 10/2013 | Hashimura ............ G02B 5/206 |
| | | 359/359 |
| 2015/0002928 A1* | 1/2015 | Kiyoto ................. C03C 17/007 |
| | | 359/360 |
| 2017/0102487 A1 | 4/2017 | Lee et al. |
| 2017/0190923 A1* | 7/2017 | Tsuruta ................. C09B 57/004 |
| 2018/0190848 A1* | 7/2018 | Ikoma ................... C09K 11/06 |

FOREIGN PATENT DOCUMENTS

| | | |
|---|---|---|
| JP | 2009227860 A | 10/2009 |
| KR | 20060058560 A | 5/2006 |
| KR | 20070097426 A | 10/2007 |
| KR | 20090023982 A | 3/2009 |
| KR | 10-1348254 B1 | 1/2014 |
| KR | 10-1427307 B1 | 8/2014 |
| KR | 20150094631 A | 8/2015 |
| KR | 20170041951 A | 4/2017 |

\* cited by examiner

OPTICAL FILTERS AND IMAGE SENSORS AND CAMERA MODULES AND ELECTRONIC DEVICES

CROSS-REFERENCE TO RELATED APPLICATION

This application claims priority to and the benefit of Korean Patent Application No. 10-2019-0081629 filed in the Korean Intellectual Property Office on Jul. 5, 2019, the entire contents of which are incorporated herein by reference.

BACKGROUND

1. Field

Optical filters, image sensors, camera modules, and electronic devices are disclosed.

2. Description of the Related Art

Electronic devices including an image sensor that stores an image as an electrical signal, such as cell phones, digital cameras, camcorders, and cameras, have been widely used.

Electronic devices may include an optical filter in order to reduce generation of an optical distortion by light in the other regions (e.g., other wavelength spectra) than a visible region (e.g., visible wavelength spectrum) or improve visibility by light in the other regions than a visible region.

SUMMARY

Some example embodiments provide an optical filter capable of achieving desired optical properties for light except for visible regions with a thin thickness.

Some example embodiments provide an image sensor including the optical filter.

Some example embodiments provide a camera module including the optical filter or the image sensor.

Some example embodiments provide an electronic device including the optical filter, the image sensor, or the camera module.

According to some example embodiments, an optical filter may include a light absorbing layer and a conductive nanodisk. The light absorbing layer may include a near-infrared absorbing material configured to absorb light of a first wavelength spectrum, the first wavelength spectrum encompassed within a near-infrared wavelength spectrum. The conductive nanodisk may be configured to absorb, reflect, or scatter light of a second wavelength spectrum, the second wavelength spectrum at least partially overlapping the first wavelength spectrum.

The light absorbing layer may be in contact with at least one of a lower surface, an upper surface, or a side surface of the conductive nanodisk.

The conductive nanodisk may be a metal nanodisk, such that the conductive nanodisk includes a metal material.

A ratio of a diameter of the conductive nanodisk to a thickness of the conductive nanodisk may be greater than or equal to about 8.

A diameter of the conductive nanodisk may be about 80 nm to about 300 nm.

A thickness of the conductive nanodisk may be about 1 nm to about 20 nm.

A transmission spectrum of the near-infrared absorbing material may have a first minimum transmission wavelength that is within the first wavelength spectrum. A transmission spectrum of the conductive nanodisk may have a second minimum transmission wavelength that is within the second wavelength spectrum. The first minimum transmission wavelength and the second minimum transmission wavelength may be both within a wavelength spectrum of about 700 nm to about 990 nm.

A difference between the first minimum transmission wavelength and the second minimum transmission wavelength may be less than or equal to about 100 nm.

A transmission spectrum of the optical filter may overlap both the first wavelength spectrum and the second wavelength spectrum and may have a wavelength width that is wider than each of the first wavelength spectrum and the second wavelength spectrum.

The wavelength width of the transmission spectrum of the optical filter at 50% transmittance may be greater than or equal to about 100 nm.

A ratio of an average transmittance of the optical filter in the near-infrared wavelength spectrum relative to an average transmittance of the optical filter in a visible wavelength spectrum may be less than or equal to about 0.18.

An average transmittance of the optical filter in a wavelength spectrum of about 430 nm to about 565 nm may be greater than or equal to about 80%. An average transmittance of the optical filter in a wavelength spectrum of about 700 nm to about 800 nm or about 890 nm to about 990 nm may be less than or equal to about 20%.

An average reflectance of the optical filter in the wavelength spectrum of about 700 nm to about 800 nm or about 890 nm to about 990 nm may be less than or equal to about 30%.

A surface coverage of the conductive nanodisk may be about 5% to about 50% of a total area of the optical filter.

The optical filter may further include a binder or a cured product thereof. The conductive nanodisk may be included in the optical filter in an amount of about 5 wt % to about 30 wt % based on a total weight of the conductive nanodisk, the near-infrared absorbing material, and the binder or the cured product thereof.

A camera may include the optical filter.

An image sensor may include a semiconductor substrate including a plurality of photodiodes. The optical filter may be on the semiconductor substrate.

The image sensor may further include a color filter layer below or above the optical filter.

A camera may include the image sensor.

An electronic device may include the camera.

According to some example embodiments, an optical filter may include a light absorbing layer and a conductive nanodisk. The light absorbing layer may include a light absorbing material configured to absorb light of a first wavelength spectrum. The conductive nanodisk may be configured to absorb, reflect, or scatter light of a second wavelength spectrum, the second wavelength spectrum at least partially overlapping the first wavelength spectrum.

The light absorbing layer may include a near-infrared absorbing material, and the first wavelength spectrum may be encompassed within a near-infrared wavelength spectrum.

The light absorbing layer may be in contact with at least one of a lower surface, an upper surface, or a side surface of the conductive nanodisk.

The conductive nanodisk may be a metal nanodisk, such that the conductive nanodisk includes a metal material.

A ratio of a diameter of the conductive nanodisk to a thickness of the conductive nanodisk may be greater than or equal to about 8.

A diameter of the conductive nanodisk may be about 80 nm to about 300 nm.

A thickness of the conductive nanodisk may be about 1 nm to about 20 nm.

A transmission spectrum of the light absorbing material may have a first minimum transmission wavelength that is within the first wavelength spectrum. A transmission spectrum of the conductive nanodisk may have a second minimum transmission wavelength that is within the second wavelength spectrum. A difference between the first minimum transmission wavelength and the second minimum transmission wavelength may be less than or equal to about 100 nm.

A transmission spectrum of the optical filter may overlap both the first wavelength spectrum and the second wavelength spectrum and may have a wavelength width that is wider than each of the first wavelength spectrum and the second wavelength spectrum.

The wavelength width of the transmission spectrum of the optical filter at 50% transmittance may be greater than or equal to about 100 nm.

DETAILED DESCRIPTION

Figure 1:
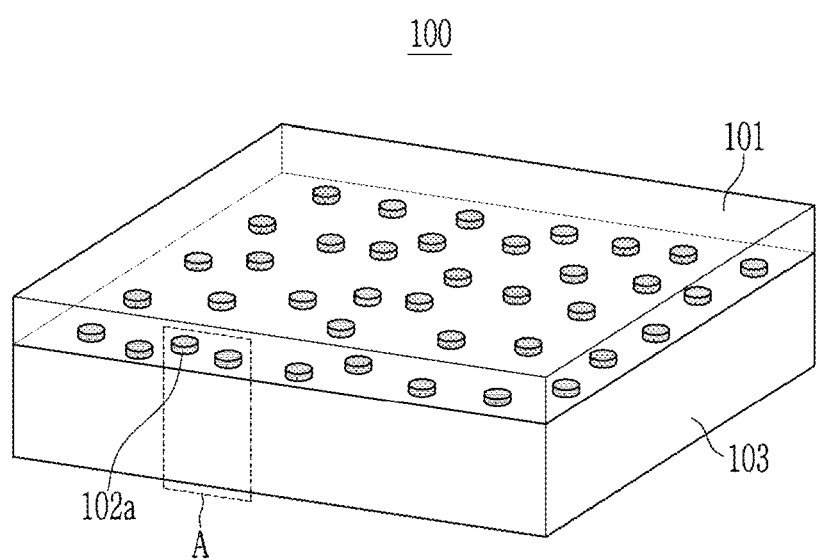
FIG. 1 is a schematic view illustrating an example of an optical filter according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, an optical filter according to some example embodiments will be described with reference to drawings.

Figure 2:
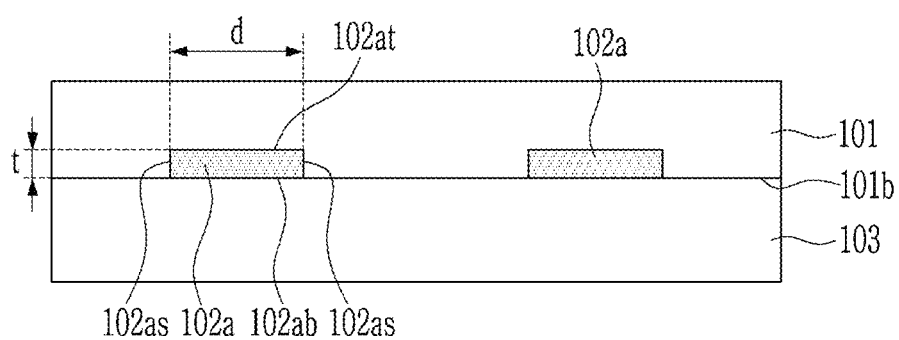
FIGS. 2, 3, and 4 are cross-sectional views showing an enlarged portion A of the optical filter of FIG. 1.
Figure 3:
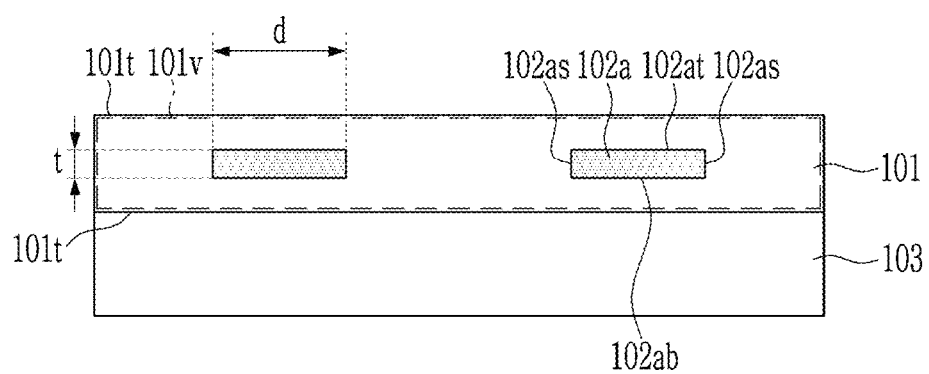
Figure 4:
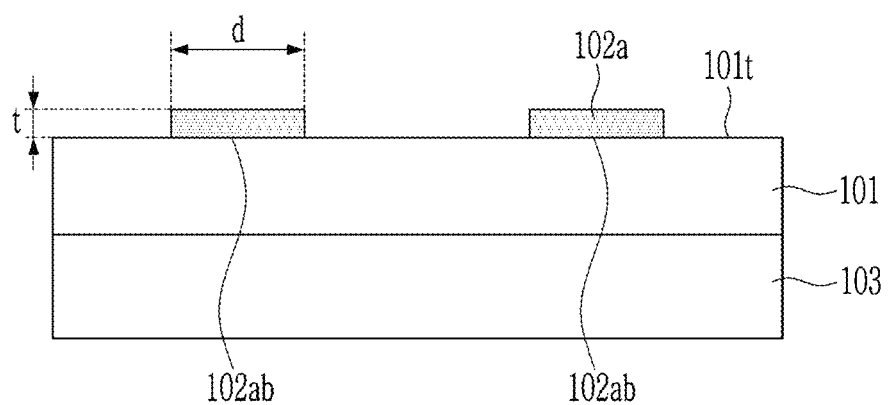

FIG. 1 is a schematic view illustrating an example of an optical filter according to some example embodiments and FIGS. 2, 3, and 4 are cross-sectional views showing an enlarged portion A of the optical filter of FIG. 1.

An optical filter 100 according to some example embodiments includes a light absorbing layer 101, one or more (e.g., a plurality of) conductive nanodisks 102a, and a substrate layer 103. In some example embodiments, the substrate layer 103 may be omitted from the optical filter 100.

The light absorbing layer 101 may include a near-infrared absorbing material configured to absorb light at least a portion of the near-infrared wavelength spectra, and the near-infrared absorbing material may be one or two or more types, for example an organic material, an inorganic material, an organic/inorganic material, or a combination thereof.

The near-infrared absorbing material may be configured to mainly absorb light of a particular (or, alternatively, predetermined) wavelength spectrum (hereinafter referred to as a 'first wavelength spectrum') belonging to (e.g., included in, encompassed within, etc.) a near-infrared wavelength spectrum, and the first wavelength spectrum may for example belong to a wavelength spectrum of about 600 nm to about 1200 nm. The transmission spectrum of the near-infrared absorbing material may have a first minimum transmission wavelength ($\lambda_{min,T1}$) belonging to (e.g., within, encompassed by, etc.) the first wavelength spectrum by absorption of light in the first wavelength spectrum. The minimum transmission wavelength ($\lambda_{min,T1}$) may for example belong to a wavelength spectrum of about 600 nm to about 1100 nm, about 600 nm to about 1000 nm, about 600 nm to about 990 nm, about 600 nm to about 900 nm, about 600 nm to about 800 nm, about 650 nm to about 1100 nm, about 650 nm to about 1000 nm, about 650 nm to about 990 nm, about 650 nm to about 900 nm, about 650 nm to about 800 nm, about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1000 nm, about 800 nm to about 990 nm, about 850 nm to about 990 nm, about 870 nm to about 990 nm, or about 890 nm to about 990 nm.

The near-infrared absorbing material may include for example a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole) compound, a boron-dipyrromethene compound, a nickel-dithiol complex compound, a croconium compound, a derivative thereof, or a combination thereof, but is not limited thereto.

The light absorbing layer 101 including the near-infrared absorbing material may have a (average) refractive index in visible and near-infrared wavelength spectra (e.g., about 400 nm to about 1000 nm) of less than or equal to about 2.0 or less than or equal to about 1.8, for example about 1.1 to about 2.0 or about 1.1 to about 1.8. For example, the light absorbing layer 101 including the near-infrared absorbing material may have a (average) refractive index in a wavelength spectrum of about 900 nm to about 1000 nm (e.g., 940 nm) of less than or equal to about 2.0 or less than or equal to about 1.8, for example about 1.1 to about 2.0 or about 1.1 to about 1.8. For example, the light absorbing layer 101 including the near-infrared absorbing material may have an (average) absorption coefficient of about 0.01 to about 0.5 in visible and near-infrared wavelength spectra (e.g., about 400 nm to about 1000 nm). For example, it may have an (average) absorption coefficient of about 0.01 to about 0.5 in a wavelength spectrum of about 900 nm to about 1000 nm (e.g., 940 nm).

The light absorbing layer 101 may have a thickness of about 1 nm to about 1000 nm, for example about 10 nm to about 1000 nm, about 10 nm to about 800 nm, about 10 nm to about 700 nm, about 10 nm to about 500 nm, or about 10 nm to about 300 nm.

FIG. 1 illustrates that the optical filter 100 includes a plurality of conductive nanodisks 102a, but it will be understood that example embodiments are not limited thereto, and the optical filter 100 may include one or more conductive nanodisks 102a. The plurality of conductive nanodisks 102a may be arranged periodically or randomly. The plurality of conductive nanodisks 102a may be adjacent to the light absorbing layer 101 and may for example be in contact with the light absorbing layer 101. For example, the light absorbing layer 101 may be in contact with at least one surface of the lower surface 102ab, upper surface 102at, or side surface 102as of one or more conductive nanodisks 102a, and the conductive nanodisks 102a may be disposed under, on, and/or inside the light absorbing layer 101.

For example, referring to FIG. 2, a plurality of conductive nanodisks 102a may be disposed under the light absorbing layer 101, and the light absorbing layer 101 may be in contact with the upper and side surfaces 102at and 102as of the conductive nanodisks 102a. In some example embodiments, the light absorbing layer 101 may not be in contact with the lower surfaces 102ab, when the plurality of conductive nanodisks 102a are disposed under the light absorbing layer 101, as shown in FIG. 2. As shown in FIG. 2, where the optical filter 100 includes substrate layer 103, the top and side surfaces 102at and 102as of the conductive nanodisks 102a are in contact with the light absorbing layer 101, and the bottom surfaces 102ab of the conductive nanodisks 102a are in contact with the substrate layer 103. As further shown in FIG. 2, the lower surface 101b of the light absorbing layer 101 may be coplanar with the lower surfaces 102ab, when the plurality of conductive nanodisks 102a are disposed under the light absorbing layer 101.

For example, referring to FIG. 3, a plurality of conductive nanodisks 102a may be disposed inside the light absorbing layer 101, and the light absorbing layer 101 may be in contact with the lower, upper, and side surfaces 102ab, 102at, and 102as of the conductive nanodisks 102a. As shown in FIG. 3, the surfaces 102ab, 102at, and 102as of the conductive nanodisks 102a may be isolated from the outer surfaces (e.g., top and lower surfaces 101t and 101b) of the light absorbing layer 101, and thus isolated by the light absorbing layer 101 from an exterior of the volume space 101v defined by the outer surfaces of the light absorbing layer 101, when the plurality of conductive nanodisks 102a are inside the light absorbing layer 101.

For example, referring to FIG. 4, a plurality of conductive nanodisks 102a may be disposed on the light absorbing layer 101, and a top surface 101t of the light absorbing layer 101 may be in contact with the lower surfaces 102ab of the conductive nanodisks 102a. In some example embodiments where the optical filter 100 includes the substrate layer 103, the light absorbing layer 101 is entirely between the conductive nanodisks 102a and the substrate layer 103, and thus the light absorbing layer 101 may not be in contact with any of the side surfaces 102as or top surfaces 102at, when the plurality of conductive nanodisks 102a are disposed on the light absorbing layer 101, as shown in FIG. 4.

It will be understood that, in some example embodiments, an optical filter 100 may include at least one conductive nanodisk 102a that is under the light absorbing layer 101, as shown in FIG. 2, at least one conductive nanodisk 102a that is inside the light absorbing layer 101, as shown in FIG. 3, and at least one conductive nanodisk 102a that is on the light absorbing layer 101, as shown in FIG. 4.

The conductive nanodisks 102a may be disk-shaped nanomaterials, and may be nanobodies configured to absorb, reflect, and/or scatter light of a particular (or, alternatively, predetermined) wavelength spectrum due to localized surface plasmon resonance. The conductive nanodisks 102a may be for example metal nanodisks (e.g., at least partially comprising a metal material) and may at least partially comprise, for example, gold (Au), silver (Ag), aluminum (Al), copper (Cu), alloys thereof, or a combination thereof, but are not limited thereto.

For example, a wavelength spectrum (hereinafter referred to as a 'second wavelength spectrum') capable to cause localized surface plasmon resonance may at least partially overlap with the first wavelength spectrum, which is the absorption wavelength of the near-infrared absorbing material described above, and the conductive nanodisks 102a may be configured to absorb, reflect, or scatter light in the second wavelength spectrum. For example, the second wavelength spectrum may be narrower than the first wavelength spectrum and may fall within (e.g., may be completely encompassed within) the first wavelength spectrum. In another example, the second wavelength spectrum may be wider than the first wavelength spectrum such that the first wavelength spectrum may fall within (e.g., may be completely encompassed within) the second wavelength spectrum. In another example, the second wavelength spectrum may partially overlap with the first wavelength spectrum, such that a portion of the second wavelength spectrum is outside the first wavelength spectrum.

The second wavelength spectrum may for example belong to a wavelength spectrum of greater than about 600 nm and less than or equal to about 1200 nm, for example about 600 nm to about 1100 nm, about 600 nm to about 1000 nm, about 600 nm to about 990 nm, about 600 nm to about 900 nm, about 600 nm to about 800 nm, about 650 nm to about 1100 nm, about 650 nm to about 1000 nm, about 650 nm to about 990 nm, about 650 nm to about 900 nm, about 650 nm to about 800 nm, about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1000 nm, about 800 nm to about 990 nm, about 850 nm to about 990 nm, about 870 nm to about 990 nm, or about 890 nm to about 990 nm.

The conductive nanodisks 102a may be configured to effectively block light in the second wavelength spectrum by absorbing or scattering light belonging to the second wavelength spectrum. The transmission spectrum of the conductive nanodisks 102a may have a second minimum transmission wavelength ($\lambda_{min,T2}$) belonging to (e.g., within, encompassed by, etc.) the second wavelength spectrum. The second minimum transmission wavelength ($\lambda_{min,T2}$) may belong to a wavelength spectrum of about 600 nm to about 1100 nm, about 600 nm to about 1000 nm, about 600 nm to about 990 nm, about 600 nm to about 900 nm, about 600 nm to about 800 nm, about 650 nm to about 1100 nm, about 650 nm to about 1000 nm, about 650 nm to about 990 nm, about 650 nm to about 900 nm, about 650 nm to about 800 nm, about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1000 nm, about 800 nm to about 990 nm, about 850 nm to about 990 nm, about 870 nm to about 990 nm, or about 890 nm to about 990 nm.

For example, the first minimum transmission wavelength ($\lambda_{min,T1}$) of the near-infrared absorbing material and the second minimum transmission wavelength ($\lambda_{min,T2}$) of the conductive nanodisks 102a may for example belong to (e.g., may both be within) a wavelength spectrum of about 600 nm to about 1100 nm, about 600 nm to about 1000 nm, about 600 nm to about 990 nm, about 600 nm to about 900 nm, about 600 nm to about 800 nm, about 650 nm to about 1100 nm, about 650 nm to about 1000 nm, about 650 nm to about 990 nm, about 650 nm to about 900 nm, about 650 nm to about 800 nm, about 700 nm to about 1100 nm, about 700 nm to about 1000 nm, about 700 nm to about 990 nm, about 700 nm to about 900 nm, about 700 nm to about 800 nm, about 750 nm to about 1100 nm, about 750 nm to about 1000 nm, about 750 nm to about 990 nm, about 750 nm to about 900 nm, about 750 nm to about 800 nm, about 800 nm to about 1000 nm, about 800 nm to about 990 nm, about 850 nm to about 990 nm, about 870 nm to about 990 nm, or about 890 nm to about 990 nm.

For example, a difference between the first minimum transmission wavelength ($\lambda_{min,T1}$) of the near-infrared absorbing material and the second minimum transmission wavelength ($\lambda_{min,T2}$) of the conductive nanodisks 102a may be less than or equal to about 100 nm, for example less than or equal to about 80 nm, less than or equal to about 70 nm, less than or equal to about 50 nm, less than or equal to about 40 nm, less than or equal to about 30 nm, less than or equal to about 20 nm, or less than or equal to about 10 nm.

The conductive nanodisks 102a may be three-dimensional structures having a shape and a size (dimension) configured to absorb or reflect light in the second wavelength spectrum, wherein the size may be a diameter (d) and a thickness (t).

For example, the conductive nanodisks 102a may each be a thin nanostructure having a flat surface, and a ratio of the diameter (d) relative to the thickness (t) of the conductive nanodisks 102a may be greater than or equal to about 8, greater than or equal to about 9, greater than or equal to about 10, greater than or equal to about 12, or greater than or equal to about 15, within the ranges about 8 to about 20, about 9 to about 20, about 10 to about 20, about 12 to about 20, or about 15 to about 20.

For example, the diameter (d) of the conductive nanodisks 102a may be tens of nanometers to about hundreds of nanometers, for example greater than or equal to about 80 nm, within the ranges, for example about 80 nm to about 500 nm, about 80 nm to about 400 nm, 80 nm to about 300 nm, or 80 nm to about 200 nm.

For example, the thickness (t) of the conductive nanodisks 102a may be several nanometers to tens of nanometers, for example less than or equal to about 60 nm, less than or equal to about 40 nm, less than or equal to about 30 nm, or less than or equal to about 20 nm, within the ranges, for example about 1 nm to about 60 nm, about 1 nm to about 50 nm, about 1 nm to about 40 nm, about 1 nm to about 30 nm, about 1 nm to about 20 nm, or about 1 nm to about 10 nm.

The conductive nanodisks 102a may have a surface coverage (e.g., a collective surface area of the top surfaces 102at of the conductive nanodisks 102a) of less than or equal to about 50% based on a total area of the optical filter 100 (e.g., a total surface area of the top surface 101t of the light absorbing layer 101), within the range, for example about 1% to about 50%, about 3% to about 50%, about 5% to about 50%, about 5% to about 40%, about 5% to about 30%, about 5% to about 20%, about 10% to about 50%, about 10% to about 40%, or about 10% to about 30%. The surface coverage may be an area occupied by a plurality of conductive nanodisks 102a based on a total area of the optical filter 100, and may be measured by analyzing an image using for example an electron microscope, an atom microscope, or a surface analyzer.

The substrate layer 103 is disposed under a plurality of conductive nanodisks 102a and light absorbing layer 101 to support the plurality of conductive nanodisks 102a and light absorbing layer 101. The substrate layer 103 may be a transparent substrate layer and may have a light transmittance of greater than or equal to about 85% or greater than or equal to about 90% in a wavelength spectrum of about 400 nm to about 1000 nm.

The substrate layer 103 may have a refractive index that is lower than the refractive index of conductive nanodisks 102a. The substrate layer 103 may have a refractive index of less than or equal to about 1.7, for example about 1.4 to about 1.7, in visible and near-infrared wavelength spectra (e.g., about 400 nm to about 1000 nm), and may have a refractive index of less than or equal to about 1.7, for example about 1.4 to about 1.7 in a wavelength spectrum of about 900 nm to about 1000 nm (e.g., 940 nm). The substrate layer 103 may include an organic material, an inorganic material, an organic/inorganic material or a combination thereof, for example oxide, nitride, sulfide, fluoride, polymer or a combination thereof, for example glass, silicon oxide, aluminum oxide, magnesium fluoride, polystyrene, polymethylmethacrylate, polycarbonate, or a combination thereof, but is not limited thereto.

For example, the aforementioned plurality of conductive nanodisks 102a and light absorbing layer 101 may be formed from a composition including conductive nanodisks 102a and a near-infrared absorbing material.

The composition may optionally further include a binder or a cured product thereof, in addition to the aforementioned plurality of conductive nanodisks 102a and near-infrared absorbing material. The binder may be a transparent polymer, and is not particularly limited as long as it is a material capable of mixing with the near-infrared absorbing material, dispersing in the near-infrared absorbing material, or binding the near-infrared absorbing material. The binder may be a curable binder, for example a thermally curable binder, a photo-curable binder, or a combination thereof.

The binder may be for example (meth)acryl, methyl cellulose, ethyl cellulose, hydroxypropyl methyl cellulose (HPMC), hydroxylpropyl cellulose (HPC), xanthan gum, polyvinyl alcohol (PVA), polyvinyl pyrrolidone (PVP), a cyclic olefin polymer (COP), carboxy methyl cellulose, hydroxyl ethyl cellulose, silicone, organic-inorganic hybrid materials, a copolymer thereof, or a combination thereof, but is not limited thereto.

The optical filter 100 may include a cured product of the near-infrared absorbing material and/or the binder.

The near-infrared absorbing material may be for example included in the optical filter 100 in an amount of about 0.01 to about 50 parts by weight, about 0.01 to about 30 parts by weight, about 0.01 to about 20 parts by weight, about 0.01 to about 15 parts by weight, or about 0.01 to about 10 parts by weight based on 100 parts by weight of the binder.

The conductive nanodisks 102a may be included in the optical filter 100 in an amount of greater than or equal to about 5 wt %, for example about 5 wt % to about 50 wt %, about 5 wt % to about 40 wt %, about 5 wt % to about 30 wt % or about 5 wt % to about 20 wt % based on a total weight of the conductive nanodisks 102a, near-infrared absorbing material, and binder or cured product thereof.

The composition may optionally further include a solvent, in addition to the aforementioned conductive nanodisks 102a, near-infrared absorbing material, and binder.

The composition may be coated and dried on the substrate layer 103 and optionally cured. The coating may be for example a spin coating, a slit coating, a bar coating, a blade coating, a slot die coating, and/or an inkjet coating. The drying may be for example performed by natural drying, hot air drying, and/or a heat treatment at a higher temperature than the boiling point of the aforementioned solvent. The curing may be thermal curing, photo curing, or a combination thereof.

For example, the aforementioned plurality of conductive nanodisks 102a may be formed by deposition or sputtering, and the light absorbing layer 101 may be formed from a composition including the near-infrared absorbing material, binder, and solvent.

The optical filter 100 may have a thickness of less than or equal to about 10 μm, less than or equal to about 5 μm, less than or equal to about 3 μm, less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm. For example, the thickness of the optical filter 100 may be in a range of about 100 nm to about 10 μm, about 100 nm to about 5 μm, about 100 nm to about 3 μm, about 100 nm to about 2 μm, about 100 nm to about 1 μm, about 100 nm to about 900 nm, about 100 nm to about 800 nm, about 100 nm to about 700 nm, about 100 nm to about 600 nm, or about 100 nm to about 500 nm.

The optical filter 100 may exhibit high light absorption characteristics for light in a near-infrared wavelength spectrum with a thin thickness by a combination of the plurality of conductive nanodisks 102a and the light absorbing layer 101. Specifically, the optical filter 100 may be configured to scatter light in the near-infrared wavelength spectrum by localized surface plasmon resonance generated at the interface of the conductive nanodisks 102a and the light absorbing layer 101, while the light absorbing layer 101 neighboring therewith may be configured to multi-absorb the scattered light and thus have a high light absorption effect about light in the near-infrared wavelength spectrum. An absorbed light amount due to this multi-absorption may be greatly higher than an absorbed light amount without the plurality of conductive nanodisks 102a, that is, a plane structure, is once passing through the light absorbing layer 101.

Accordingly, a transmission spectrum of the optical filter 100 may overlap both the first wavelength spectrum absorbed by the light absorbing layer 101 and the second wavelength spectrum absorbed or scattered by the conductive nanodisks 102a, and the transmission spectrum of the optical filter 100 may have a wider wavelength width (e.g., a larger wavelength spectrum) than each of a width of the first wavelength spectrum and a width of the second wavelength spectrum. For example, a wavelength width of the transmission spectrum of the optical filter 100 at a transmittance of 50% may be greater than or equal to about 100 nm within the range, greater than or equal to about 120 nm, greater than or equal to about 140 nm, greater than or equal to about 150 nm, greater than or equal to about 180 nm, greater than or equal to about 200 nm, greater than or equal to about 210 nm, greater than or equal to about 220 nm, greater than or equal to about 230 nm, greater than or equal to about 240 nm, or greater than or equal to about 250 nm, or about 100 nm to about 300 nm, about 120 nm to about 300 nm, about 140 nm to about 300 nm, about 150 nm to about 300 nm, about 180 nm to about 300 nm, about 200 nm to about 300 nm, about 210 nm to about 300 nm, about 220 nm to about 300 nm, about 230 nm to about 300 nm, about 240 nm to about 300 nm, or about 250 nm to about 300 nm. Accordingly, the optical filter 100 may exhibit high light absorption characteristics over a wide wavelength width in the near-infrared wavelength spectrum.

On the other hand, the optical filter 100 may increase a transmittance of light in the visible wavelength spectrum by a combination of the light absorbing layer 101 and the conductive nanodisks 102a compared with a case of including the light absorbing layer 101 alone or the conductive nanodisks 102a alone.

Accordingly, the optical filter 100 may increase a transmittance of light in the visible wavelength spectrum and absorbance in the near-infrared wavelength spectrum and thus much further increase an effect of selectively blocking the near-infrared wavelength spectrum.

For example, the optical filter 100 may have an average transmittance ($T_{VIS}$) of greater than or equal to about 80% in the visible wavelength spectrum, and within the range, greater than or equal to about 85%, greater than or equal to about 88%, greater than or equal to about 90%, greater than or equal to about 93%, greater than or equal to about 95%, greater than or equal to about 97%, or greater than or equal to about 99%. Herein, the visible wavelength spectrum may be for example a particular (or, alternatively, predetermined) wavelength spectrum belonging to a range of greater than or equal to about 400 nm and less than 700 nm, for example, about 430 nm to about 565 nm. In some example embodiments, an average transmittance of the optical filter 100 in a wavelength spectrum of about 430 nm to about 565 is greater than or equal to about 80%, and an average transmittance of the optical filter 100 in a wavelength spectrum of about 700 nm to about 800 nm, or about 890 to about 990 nm is less than or equal to about 20%.

For example, the average transmittance ($T_{NIR}$) of the optical filter 100 in the near-infrared wavelength spectrum may be lower than the case of having the light absorbing layer 101 alone or the conductive nanodisks 102a alone, for example, about 1.5 times or more, about twice or more, about 3 times or more, about 4 times or more, or about 5 times or more, for example, about 1.5 times to about 50 times, about twice to about 50 times, about 3 times to about 50 times, about 4 times to about 50 times, or about 5 times to about 50 times lower than the case. The average transmittance ($T_{NIR}$) of the optical filter 100 in the near-infrared wavelength spectrum may be for example less than or equal to about 20%, and within the range, less than or equal to about 18%, less than or equal to about 15%, less than or equal to about 12%, less than or equal to about 10%, less than or equal to about 8%, less than or equal to about 7%, less than or equal to about 5%, or less than or equal to about 3%. Herein, the near-infrared wavelength spectrum may be for example a particular (or, alternatively, predetermined) wavelength spectrum belonging to about 700 nm to about 1200 nm, for example, about 700 nm to about 800 nm, or about 890 nm to about 990 nm.

For example, a ratio ($T_{NIR}/T_{VIS}$) of the average transmittance in the near-infrared wavelength spectrum of the optical filter 100 relative to the average transmittance in the visible wavelength spectrum of the optical filter 100 may be respectively lower than the case of having the light absorbing layer 101 alone and the conductive nanodisks 102a alone, for example, about twice or more, about 3 times or more, about 4 times or more, or about 5 times or more, for example, about twice to about 50 times, about 3 times to about 50 times, about 4 times to about 50 times, or about 5 times to about 50 times lower than the case. The ratio ($T_{NIR}/T_{VIS}$) of the average transmittance in the near-infrared wavelength spectrum of the optical filter 100 relative to the average transmittance in the visible wavelength spectrum of the optical filter 100 may be for example less than or equal to about 0.25, and within the range, less than or equal to about 0.20, less than or equal to about 0.18, less than or equal to about 0.15, less than or equal to about 0.10, less than or equal to about 0.08, or less than or equal to about 0.05.

For example, the average reflectance ($R_{NIR}$) in the near-infrared wavelength spectrum of the optical filter 100 may be lower than that of a case of including the conductive nanodisks 102a alone, for example, about twice or more, about 4 times or more, or about 5 times or more, for example, about twice to about 50 times, about 4 times to about 50 times, or about 5 times to about 50 times lower than the case. For example, the average reflectance ($R_{NIR}$) in the near-infrared wavelength spectrum of the optical filter 100 may be higher than that of the case of including the light absorbing layer 101 alone, for example, about twice or more, about 4 times or more, or about 5 times or more, for example, about twice to about 50 times, about 4 times to about 50 times, or about 5 twice to about 50 times higher than the case. The average reflectance ($R_{NIR}$) in the near-infrared wavelength spectrum of the optical filter 100 may be for example less than or equal to about 30%, and within the range, less than or equal to about 25%, less than or equal to about 20%, less than or equal to about 15%, less than or equal to about 10%, less than or equal to about 7%, or less than or equal to about 5%. Herein, the near-infrared wavelength spectrum may be for example a particular (or, alternatively, predetermined) wavelength spectrum belonging to about 700 nm to about 1200 nm, about 700 nm to about 800 nm, or about 890 nm to about 990 nm. In some example embodiments, the average reflectance ($R_{NIR}$) in the near-infrared wavelength spectrum of the optical filter 100 in a wavelength spectrum of about 700 nm to about 800 nm or about 890 nm to about 990 nm of the optical filter is less than or equal to about 30%.

In some example embodiments, the light absorbing layer 101 may include a light absorbing material configured to absorb light of the first wavelength spectrum, where the first wavelength spectrum may not be a near-infrared wavelength spectrum, and one or more conductive nanodisks 102a of the optical filter 100 may be configured to absorb, reflect, or scatter light of a second wavelength spectrum that at least partially overlaps the first wavelength spectrum that is at least partially, or entirely, not a near-infrared wavelength spectrum. For example, in some example embodiments, the optical filter 100 includes a light absorbing layer 101 that is similar to any of the aforementioned example embodiments of the light absorbing layer 101, except that the light absorbing layer 101 includes a light absorbing material configured to absorb light of a first wavelength spectrum that is at least partially a visible wavelength spectrum, ultraviolet wavelength spectrum, infrared wavelength spectrum, or the like, and the optical filter 100 includes one or more conductive nanodisks 102a that are similar to any of the aforementioned example embodiments of the conductive nanodisks 102a, except that the one or more conductive nanodisks 102a are configured to absorb, reflect, or scatter light of a second wavelength spectrum at least partially overlapping the first wavelength spectrum and at least partially a visible wavelength spectrum, ultraviolet wavelength spectrum, infrared wavelength spectrum, or the like. Such light absorbing layer 101 and conductive nanodisks 102a may have respective and/or relative properties that are the same as the respective and/or relative properties of the light absorbing layer 101 and conductive nanodisks 102a of any example embodiments described herein.

The optical filter 100 may be applied to all applications for filtering light of a particular (or, alternatively, predetermined) wavelength spectrum, and may be effectively applied as a near-infrared cut filter configured to filter light in a near-infrared wavelength spectrum. The optical filter 100 may be usefully applied to an electronic device including for example an image sensor, a camera module (also referred to herein as a camera), and the like. The electronic device may be a digital camera, a camcorder, a monitoring camera such as CCTV, an in-car camera, a robot camera, a medical camera, a cell phone having a built-in or external camera, a computer having a built-in or external camera, a laptop computer having a built-in or external camera, and the like but is not limited thereto.

Hereinafter, an example of a camera module (e.g., camera) provided with the aforementioned optical filter 100 will be described.

Figure 5:
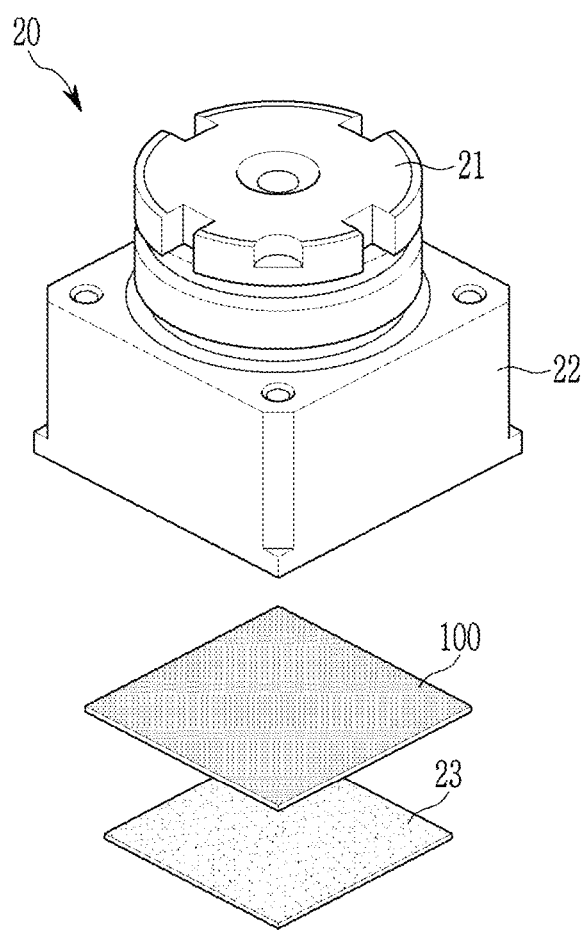
FIG. 5 is a schematic view illustrating an example of a camera module according to some example embodiments.

FIG. 5 is a schematic view showing an example of a camera module according to some example embodiments.

Referring to FIG. 5, a camera module 20 (also referred to herein as a camera) includes a lens barrel 21, a housing 22, an optical filter 100, and an image sensor 23.

The lens barrel 21 includes at least one lens imaging a subject, and the lens may be disposed along an optical axis direction. Herein, the optical axis direction may be a vertical direction of the lens barrel 21. The lens barrel 21 is internally housed in the housing 22 and united with the housing 22. The lens barrel 21 may be moved in optical axis direction inside the housing 22 for autofocusing.

The housing 22 may support and house the lens barrel 21 and the housing 22 may be open in the optical axis direction or may be designed vertically using prisms or the like.

Accordingly, incident light entered into the housing 22 may reach the image sensor 23 through the lens barrel 21 and the optical filter 100.

The housing 22 may be equipped with an actuator for moving the lens barrel 21 in the optical axis direction. The actuator may include a voice coil motor (VCM) including a magnet and a coil. However, various methods such as a mechanical driving system or a piezoelectric driving system using a piezoelectric device except for the actuator may be adopted.

The optical filter 100 is the same as described above.

The image sensor 23 may collect an image of a subject and thus store the image as data, and the stored data may be displayed as an image through a display media.

The image sensor 23 may be mounted on a substrate (not shown) and electrically connected to the substrate. The substrate may be, for example, a printed circuit board (PCB) or electrically connected to a printed circuit board, and the printed circuit may be, for example, a flexible printed circuit (FPCB).

The image sensor 23 may concentrate light passing the lens barrel 21 and the optical filter 100 and generate a video signal and may be a complementary metal-oxide semiconductor (CMOS) image sensor and/or a charge coupled device (CCD) image sensor.

Figure 6:
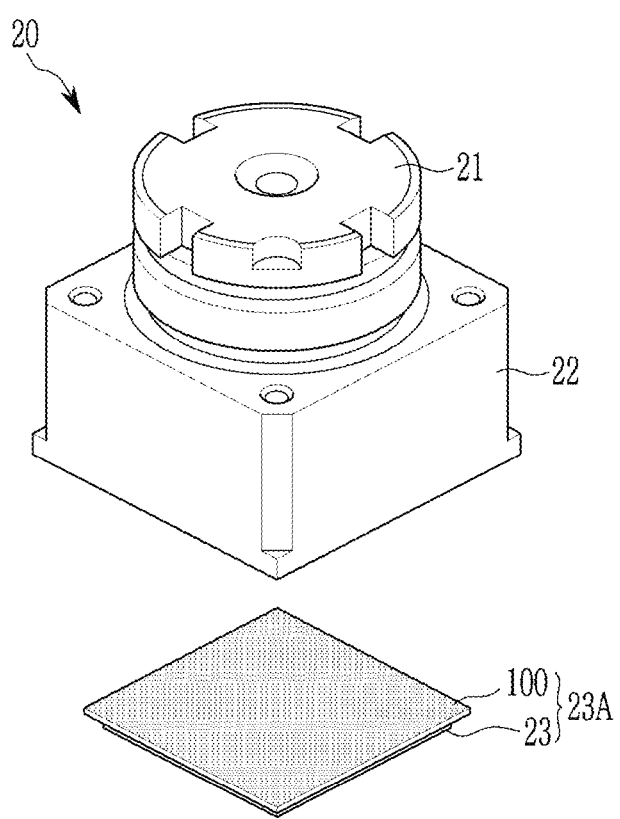
FIG. 6 is a schematic view illustrating an example of a camera module according to some example embodiments.

FIG. 6 is a schematic view showing another example of a camera module according to some example embodiments.

Referring to FIG. 6, a camera module 20 according to some example embodiments includes the lens barrel 21, the housing 22, the optical filter 100, and the image sensor 23, like the aforementioned example embodiments.

However, in the camera module 20 according to some example embodiments, the optical filter 100 and the image sensor 23 may be in contact with each other, for example the optical filter 100 and the image sensor 23 may be integrally provided.

Hereinafter, an example of an optical filter-integrated image sensor will be described with reference to a drawing. As an example of an image sensor, a CMOS image sensor is described.

Figure 7:
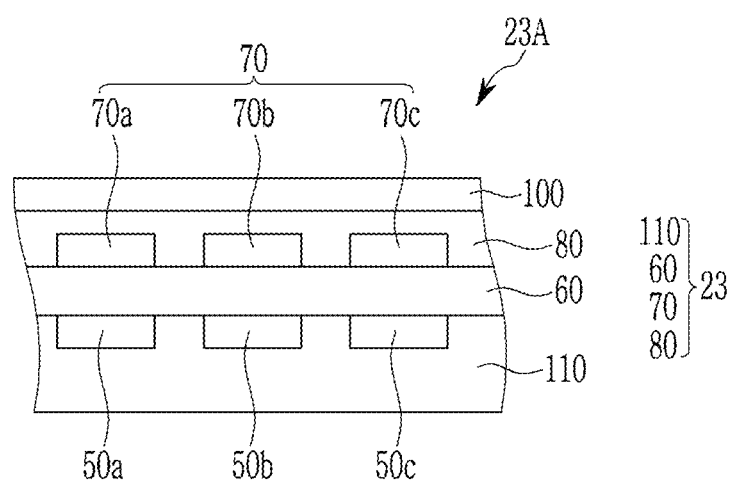
FIG. 7 is a cross-sectional view illustrating an example of an image sensor according to some example embodiments.

FIG. 7 is a cross-sectional view showing an example of an image sensor according to some example embodiments.

An integrated image sensor 23A according to some example embodiments includes an image sensor 23 including a semiconductor substrate 110, a lower insulation layer 60, a color filter layer 70 and an upper insulation layer 80; and an optical filter 100.

The semiconductor substrate 110 may be a silicon substrate, and is integrated with the photo-sensing devices 50a, 50b, and 50c, and transmission transistor (not shown). The photo-sensing devices 50a, 50b, and 50c may be photodiodes. For example, the photo-sensing device 50a may be a blue photo-sensing device 50a configured to sense light in a blue wavelength spectrum which passes a blue filter 70a described later, the photo-sensing device 50b may be a green photo-sensing device 50b configured to sense light in a green wavelength spectrum which passes a green filter 70b described later, and the photo-sensing device 50c may be a red photo-sensing device 50c configured to sense light in a red wavelength spectrum passes a red filter 70c described later. The photo-sensing devices 50a, 50b, and 50c and the transmission transistor may be integrated in each pixel. The photo-sensing devices 50a, 50b, and 50c may be configured to sense light and the sensed information may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but is not limited thereto. However, it is not limited to the structure, and the metal wire and pad may be disposed under the photo-sensing devices 50a, 50b, and 50c.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF.

A color filter layer 70 is formed on the lower insulation layer 60. The color filter layer 70 includes a blue filter 70a formed in a blue pixel, a green filter 70b formed in a green pixel, and a red filter 70c formed in a red pixel. However, the present disclosure is not limited thereto, but at least one of the blue filter 70a, the green filter 70b, or the red filter 70c may be replaced by a yellow filter, a cyan filter, or a magenta filter.

The upper insulation layer 80 is formed on the color filter layer 70. The upper insulation layer 80 may provide a flat surface by reducing stepped portions formed by the color filter layer 70. The upper insulation layer 80 may be made of an inorganic insulating material such as silicon oxide and/or silicon nitride or an organic insulating material. The upper insulation layer 80 may be omitted as needed.

The optical filter 100 is formed on the upper insulation layer 80, such that the optical filter 100 is on the semiconductor substrate 110. The optical filter 100 includes the light absorbing layer 101, the plurality of conductive nanodisks 102a, and the substrate layer 103 as described above, and may for example effectively transmit light in a visible wavelength spectrum and effectively block light in the other regions than a visible region, like a near-infrared wavelength spectrum. When the aforementioned upper insulation layer 80 is the same as the substrate layer 103 of the optical filter 100, any one of the upper insulation layer 80 or the substrate layer 103 may be omitted. Detailed descriptions of the optical filter 100 are as described above.

Focusing lens (not shown) may be further formed on the optical filter 100. However, the present disclosure is not limited thereto, and the optical filter 100 may be disposed on the focusing lens. The focusing lens may control a direction of incident light and gather the light in one region. The focusing lens may have a shape of, for example, a cylinder or a hemisphere, but is not limited thereto.

A dual bandpass filter (not shown) may be disposed under the focusing lens. The dual bandpass filter may be configured to selectively transmit light in at least two wavelength spectra of incident light and may be configured to for example selectively transmit light in a visible wavelength spectrum and in a near-infrared wavelength spectrum.

As described above, the optical filter 100 may be configured to effectively transmit light in the visible region and may be configured to effectively absorb and block light in the other regions like the near-infrared region except for the visible region and thus may transfer pure light in the visible region to the image sensor and accordingly, reduce or prevent a crosstalk generated when a signal by light of the visible region is crossed and mingled with another signal by light of a non-visible region and particularly, the near-infrared wavelength spectrum.

Particularly, the optical filter 100 may have a thin thickness of less than or equal to about 10 μm, less than or equal to about 5 μm, less than or equal to about 3 μm, less than or equal to about 2 μm, less than or equal to about 1 μm, or less than or equal to about 700 nm, and thus the optical filter 100 and the image sensor 23 may be realized into an integrated image sensor 23A, and accordingly, may realize thinness of an image sensor, a camera module, and an electronic device equipped therewith.

Figure 8:
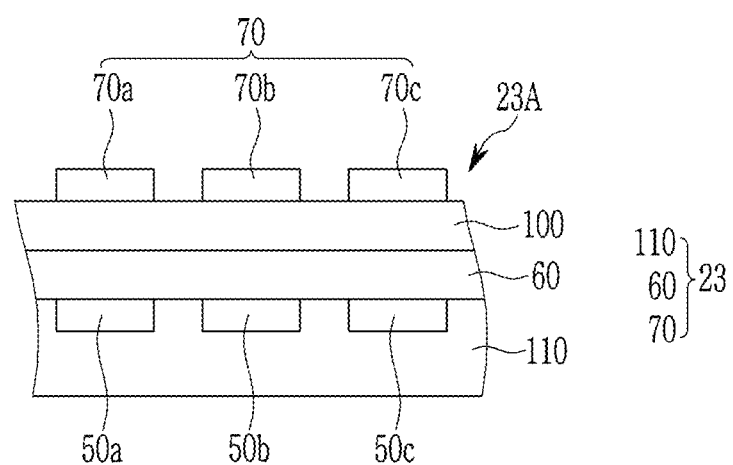
FIG. 8 is a cross-sectional view illustrating an example of an image sensor according to some example embodiments.

FIG. 8 is a cross-sectional view showing another example of an image sensor according to some example embodiments.

According to some example embodiments, an integrated image sensor 23A includes an image sensor 23 including the semiconductor substrate 110 integrated with photo-sensing devices 50a, 50b, and 50c, the lower insulation layer 60, and the color filter layer 70; and the optical filter 100, like the aforementioned example embodiments.

However, according to some example embodiments, in the integrated image sensor 23A, the optical filter 100 is disposed under (e.g., below) the color filter layer 70. In the drawing, the optical filter 100 is illustrated as an example with a structure in which the optical filter 100 is disposed between the lower insulation layer 60 and the color filter layer 70. However, the present disclosure is not limited thereto and the optical filter 100 may be disposed between the semiconductor substrate 110 and the lower insulation layer 60.

Figure 9:
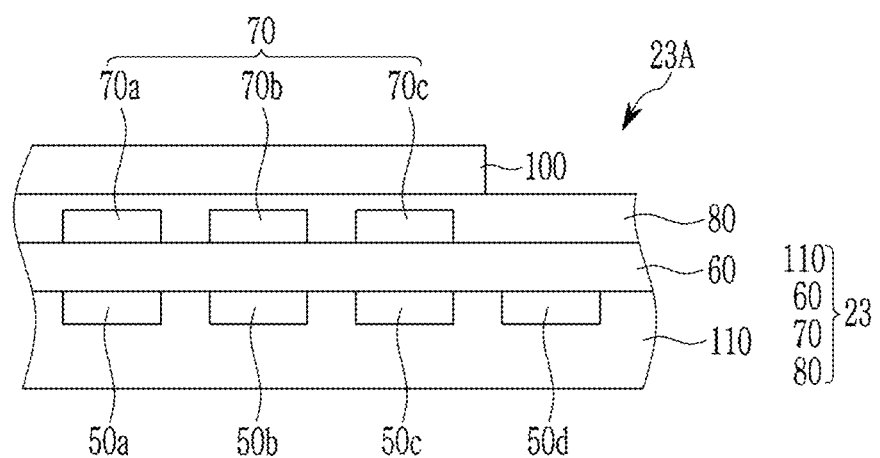
FIG. 9 is a cross-sectional view illustrating an example of an image sensor according to some example embodiments.

FIG. 9 is a cross-sectional view showing another example of an image sensor according to some example embodiments.

According to some example embodiments, an integrated image sensor 23A includes an image sensor 23 including the semiconductor substrate 110 integrated with photo-sensing device 50a, 50b, and 50c, the lower insulation layer 60, the color filter layer 70, and the upper insulation layer 80; and the optical filter 100, like the aforementioned example embodiments.

However, according to some example embodiments, the integrated image sensor 23A may include the photo-sensing device 50d to be configured to sense light belonging to the infrared wavelength spectrum additionally integrated in the semiconductor substrate 110. The color filter layer 70 may further include a visible light cut filter, a transparent filter or a white color filter (not shown) at the position corresponding to the photo-sensing device 50d or may have an empty space without a separate filter.

As shown in FIG. 8, the optical filter 100 is on the semiconductor substrate 110. The optical filter 100 may be disposed on (e.g., above) or under (e.g., below) the blue filter 70a, the green filter 70b, and the red filter 70c, but may not be disposed on or under the transparent filter or the white color filter.

The dual bandpass filter may be configured to for example selectively transmit light in a visible wavelength spectrum and in a near-infrared wavelength spectrum.

For example, the photo-sensing device 50d may be used as an auxiliary device for improving the sensitivity of the image sensor in low-illumination environments or for telephoto cameras to sharpen faint visible light images caused by fog or fine dust.

For example, the photo-sensing device 50d may be used as an infrared sensor configured to sense light in a near-infrared wavelength spectrum. The infrared sensor may be configured to extend a dynamic range specifically classifying a black/white contrast and thus increase sensing capability of a long distance 3-dimensional image. The infrared sensor may be for example a biometric sensor, for example an iris sensor, a depth sensor, a fingerprint sensor, a blood vessel distribution sensor, but is not limited thereto.

Figure 10:
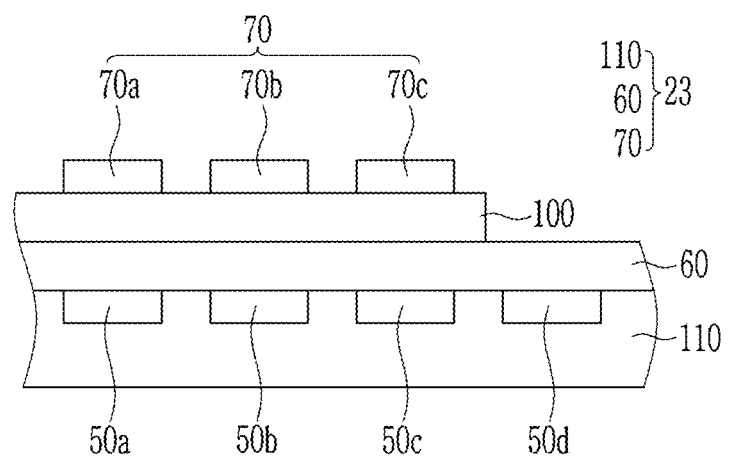
FIG. 10 is a cross-sectional view illustrating an example of an image sensor according to some example embodiments.

FIG. 10 is a cross-sectional view showing another example of an image sensor according to some example embodiments.

According to some example embodiments, an integrated image sensor 23A includes an image sensor 23 including the semiconductor substrate 110 integrated with photo-sensing devices 50a, 50b, 50c, and 50d, the lower insulation layer 60, and the color filter layer 70; and the optical filter 100, where the optical filter 100 is on the semiconductor substrate 110, like the aforementioned example embodiments.

However, according to some example embodiments, in the integrated image sensor 23A, the optical filter 100 is disposed under the color filter layer 70. In the drawing, the optical filter 100 is illustrated as an example with a structure in which the optical filter 100 is disposed between the lower insulation layer 60 and the color filter layer 70. However, the present disclosure is not limited thereto and the optical filter 100 may be disposed between the semiconductor substrate 110 and the lower insulation layer 60.

Figure 15:
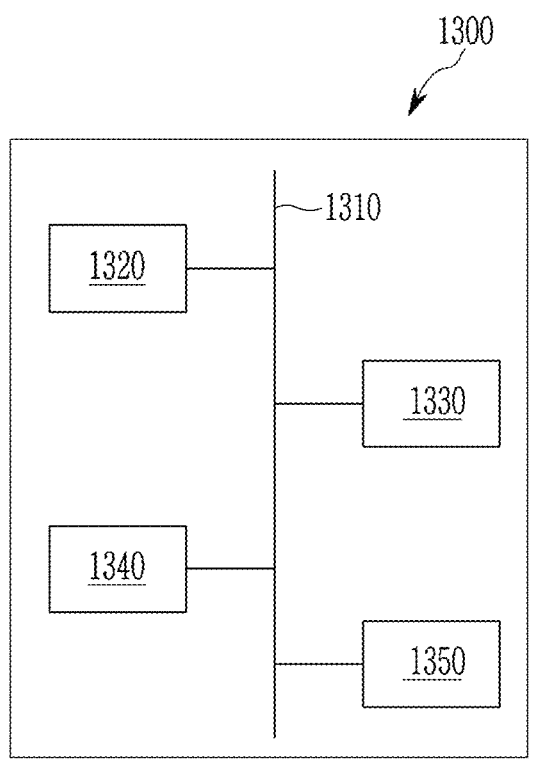
FIG. 15 is a schematic diagram of an electronic device according to some example embodiments.

FIG. 15 is a schematic diagram of an electronic device according to some example embodiments.

Referring to FIG. 15, an electronic device 1300 includes a processor 1320, a memory 1330, a sensor 1340, and a display device 1350 electrically connected through a bus 1310. The sensor 1340 may be any of the aforementioned various image sensors (e.g., 23, 23A), cameras (e.g., 20), any combination thereof, or the like, and may include any of the example embodiments of optical filters 100. The processor 1320 may perform a memory program and thus at least one function, including controlling the sensor 1340. The processor 1320 may additionally perform a memory program and thus display an image on the display device 1350. The processor 1320 may generate an output.

Hereinafter, the embodiments are illustrated in more detail with reference to examples. However, these examples are exemplary, and the present scope is not limited thereto.

Design I of Optical Filter

Example 1

An optical filter is designed by disposing a plurality of Ag nanodisk having a diameter of 96 nm and a thickness of 10 nm with a surface coverage rate of 20% on a $SiO_2$ substrate layer and then, spin-coating a mixture of 10 wt % of a near-infrared absorbing material (4,5:4",5"-dibenzo-1,1"-dibutyl-3,3,3",3"-tetramethylindatricarbocyanine hexafluorophosphate, ALFA Chemistry) and 90 wt % of a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) mixed in chloroform (3000 rpm, 20 seconds) thereon to from an about 500 nm-thick light absorbing layer (a structure of FIGS. 1 and 2).

In visible and near-infrared wavelength spectra (400 nm to 1000 nm) of the light absorbing layer, an average refractive index (n) is 1.54, and a maximum extinction coefficient (k) is 0.24. A refractive index and the extinction coefficient are obtained from a polarized light characteristic change (Delta, Psi) by using an Ellipsometry equipment (J.A. Woollam Co.).

Reference Example 1-1

Without the near-infrared absorbing material, an optical filter is designed by disposing a plurality of Ag nanodisks having a diameter of 96 nm and a thickness of 10 nm with a surface coverage rate of 20% on a $SiO_2$ substrate layer and then, spin-coating a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) solution (3000 rpm, 20 seconds) thereon to form an about 500 nm-thick transparent polymer layer.

Reference Example 1-2

Without a plurality of Ag nanodisks, an optical filter is designed by spin-coating (3000 rpm, 20 seconds) a mixture of 10 wt % of a near-infrared absorbing material (4,5:4",5"-dibenzo-1,1'-dibutyl-3,3,3",3"-tetramethylindatricarbocyanine hexafluorophosphate, ALFA Chemistry) and 90 wt % of a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) mixed in chloroform on a $SiO_2$ substrate layer to form an about 500 nm-thick light absorbing layer.

Evaluation I

A FDTD (Finite-Different Time Domain, Lumerical Inc.) software is used to perform an optical simulation of the optical filters according to Example 1 and Reference Example 1-1 and 1-2.

Figure 11:
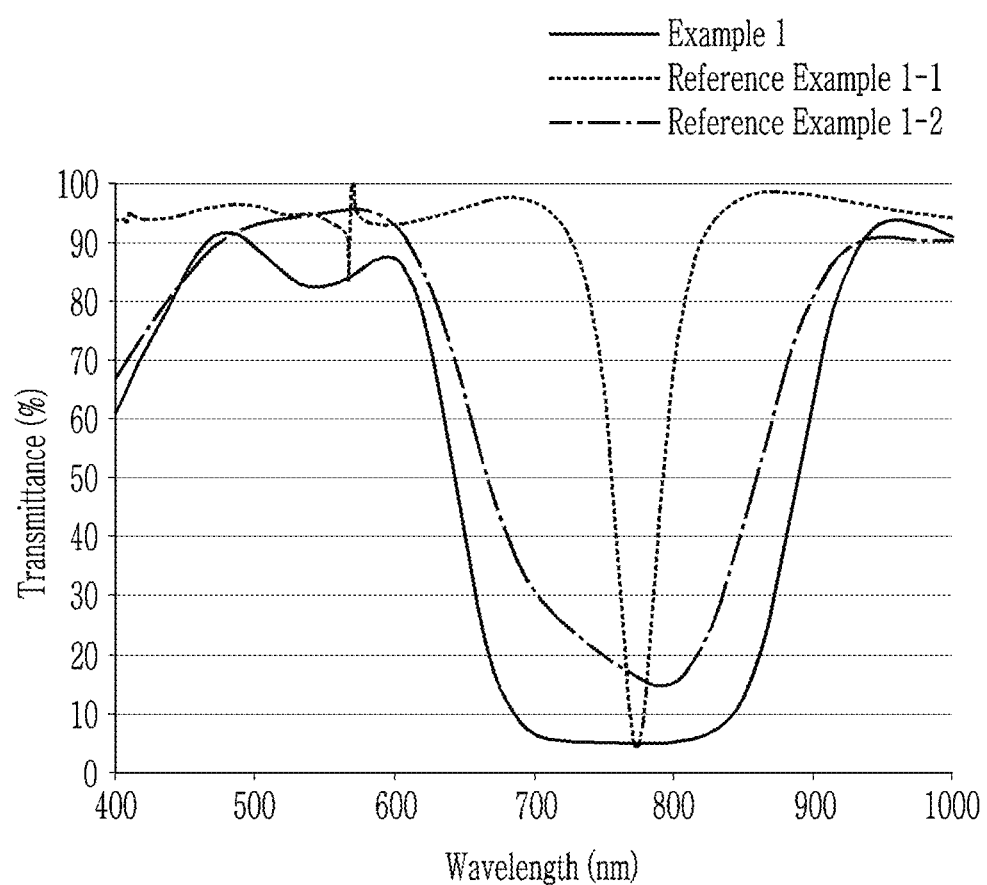
FIG. 11 is a graph showing transmission spectra of the optical filters according to Example 1 and Reference Examples 1-1 and 1-2.

The results are shown in Table 1 and FIG. 11.

FIG. 11 is a graph showing transmission spectra of the optical filters according to Example 1 and Reference Examples 1-1 and 1-2.

TABLE 1

|  | $\lambda_{min,T}$ (nm) | $W_{50\%}$ (nm) | $R_{NIR}$ (%) | $T_{NIR}$ (%) | $T_{VIS}$ (%) | $T_{NIR}/T_{VIS}$ |
|---|---|---|---|---|---|---|
| Reference Example 1-1 | 774 | 36 | 27.3 | 61.0 | 95.0 | 0.64 |
| Reference Example 1-2 | 790 | 188 | 0.3 | 21.6 | 94.7 | 0.23 |
| Example 1 | 788 | 246 | 5.3 | 5.3 | 85.7 | 0.06 |

* $\lambda_{min,T}$: minimum transmission wavelength
* $W_{50\%}$: wavelength width at a transmittance of 50%
* $R_{NIR}$: average reflectance in a near-infrared (700 nm to 800 nm) wavelength spectrum
* $T_{NIR}$: average transmittance in a near-infrared (700 nm to 800 nm) wavelength spectrum
* $A_{NIR}$: average light absorptance in a near-infrared (700 nm to 800 nm) wavelength spectrum
* $T_{VIS}$: average transmittance in a visible (430 nm to 565 nm) wavelength spectrum
* $T_{NIR} + R_{NIR} + A_{NIR} = 100$ (%)

Referring to Table 1 and FIG. 11, the optical filter according to Example 1 exhibits 5.3% of the lowest transmittance in a near-infrared wavelength spectrum (700 to 800 nm) and 246 nm of the widest wavelength width ($W_{50\%}$) of the transmission spectrum compared with those of the optical filters according to Reference Examples 1-1 and 1-2. Reference Example 1-1 exhibits reflection-based transmittance according as the reflection verse light absorption mainly occurs, but in Reference Example 1-2 and Example 1, a light loss due to the absorption verse the reflection mainly occurs. In addition, the optical filter according to Example 1 exhibits a greatly decreased ratio of transmittance in a near-infrared wavelength spectrum relative to transmittance in a visible wavelength spectrum compared with the optical filters according to Reference Examples 1-1 and 1-2, and accordingly, the optical filter of Example 1 may increase a selectively blocking effect about the near-infrared wavelength spectrum compared with the optical filters according to Reference Examples 1-1 and 1-2.

Design II of Optical Filter

Example 2

An optical filter (a structure of FIGS. 1 and 4) is designed to include an about 500 nm-thick light absorbing layer by spin-coating (3000 rpm, 20 seconds) a mixture of 10 wt % of a near-infrared absorbing material (4,5:4",5"-dibenzo-1,1'-dibutyl-3,3,3",3"-tetramethylindatricarbocyanine hexafluorophosphate, ALFA Chemistry) and 90 wt % of a cycleoolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) mixed in chloroform on a $SiO_2$ substrate layer and then, disposing a plurality of Ag nanodisk having a diameter of 138 nm and a thickness of 10 nm with a surface coverage rate of 20% thereon.

In a 400 nm to 1000 nm wavelength spectrum of the light absorbing layer, an average refractive index (n) is 1.54, and a maximum extinction coefficient (k) of 0.24.

Reference Example 2-1

Without the near-infrared absorbing material, an optical filter is designed to include an about 500 nm-thick transparent polymer layer by spin-coating (3000 rpm, 20 seconds) a cycleoolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) solution on a $SiO_2$ substrate layer and then, disposing a plurality of Ag nanodisks having a diameter of 138 nm and a thickness of 10 nm with a surface coverage rate of 20%.

Reference Example 2-2

Without the Ag nanodisks, an optical filter is designed to include a light absorbing layer formed from a near-infrared absorbing material according to the same method as Reference Example 1-2.

Evaluation II

An optical simulation is performed with respect to the optical filters according to Example 2 and Reference Examples 2-1 and 2-2 by using a FDTD software.

Figure 12:
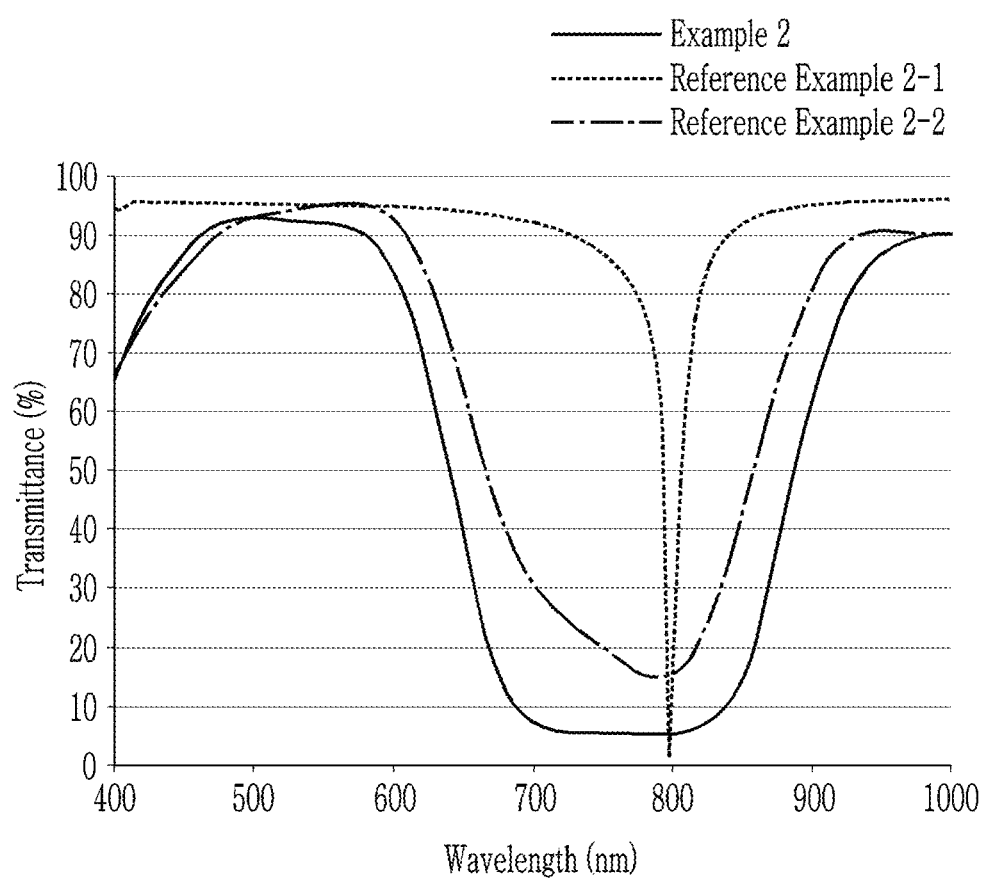
FIG. 12 is a graph showing transmission spectra of the optical filters according to Example 2 and Reference Examples 2-1 and 2-2.

The results are shown in Table 2 and FIG. 12.

FIG. 12 is a graph showing transmission spectra of the optical filters according to Example 2 and Reference Examples 2-1 and 2-2.

TABLE 2

|  | $\lambda_{min,T}$ (nm) | $W_{50\%}$ (nm) | $R_{NIR}$ (%) | $T_{NIR}$ (%) | $T_{VIS}$ (%) | $T_{NIR}/T_{VIS}$ |
|---|---|---|---|---|---|---|
| Reference Example 2-1 | 798 | 14 | 15.7 | 80.5 | 95.5 | 0.84 |
| Reference Example 2-2 | 790 | 192 | 4.3 | 20.7 | 90.7 | 0.23 |
| Example 2 | 788 | 248 | 1.8 | 1.8 | 90.7 | 0.02 |

* $\lambda_{min,T}$: minimum transmission wavelength
* $W_{50\%}$: wavelength width at a transmittance of 50%
* $R_{NIR}$: average reflectance in a near-infrared (700 nm to 800 nm) wavelength spectrum
* $A_{NIR}$: average light absorption rate in a near-infrared (700 nm to 800 nm) wavelength spectrum
* $T_{NIR}$: average transmittance in a near-infrared (700 nm to 800 nm) wavelength spectrum
* $T_{VIS}$: average transmittance in a visible (430 nm to 565 nm) wavelength spectrum
* $T_{NIR} + R_{NIR} + A_{NIR} = 100$ (%)

Referring to Table 2 and FIG. 12, the optical filter according to Example 2 exhibits the lowest transmittance of 1.8% in the near-infrared wavelength spectrum and 248 nm of the widest wavelength width of the transmission spectra compared with the optical filters according to Reference Examples 2-1 and 2-2. On the contrary, a structure of using an Ag nanodisk alone and adjacently having no light absorbing layer is sufficient for selectively reflecting light in a very narrow wavelength spectrum of 798±28 nm out of the near-infrared wavelength spectrum but insufficient for blocking a wide wavelength spectrum.

In addition, this Ag nanodisk-alone structure may cause a ghost Image, when the blocked light is mainly caused from the reflection during the image taking with a camera. In addition, the optical filter according to Example 2 exhibits a greatly-decreased ratio of the transmittance in the near-infrared wavelength spectrum relative to the transmittance in the visible wavelength spectrum compared with those of the optical filters according to Reference Examples 2-1 and 2-2 and accordingly, may increase the effect of selectively blocking the near-infrared wavelength spectrum compared with the optical filters according to Reference Examples 2-1 and 2-2.

Design III of Optical Filter

Example 3

An optical filter is designed by disposing a plurality of Ag nanodisks having a diameter of 160 nm and a thickness of 10 nm on a $SiO_2$ substrate layer with a surface coverage rate of 15% and then, spin-coating (3000 rpm, 20 seconds) a mixture of 10 wt % of a near-infrared absorbing material (Epolight 1178™, Epoline) and 90 wt % of a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) mixed in chloroform to form a 500 nm-thick light absorbing layer (a structure of FIGS. 1 and 2). The light absorbing layer has an average refractive index (n) of 1.48 and a maximum extinction coefficient (k) of 0.10 in a wavelength spectrum of 400 nm to 1000 nm.

Reference Example 3-1

Without the near-infrared absorbing material, an optical filter is designed by disposing a plurality of Ag nanodisks having a diameter of 160 nm and a thickness of 10 nm on a $SiO_2$ substrate layer with a surface coverage rate of 15% and then, spin coating (3000 rpm, 20 seconds) a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) solution thereon to form an about 500 nm-thick transparent polymer layer.

Reference Example 3-2

Without the plurality of Ag nanodisks, an optical filter is designed by spin-coating (3000 rpm, 20 seconds) a mixture of 10 wt % of a near-infrared absorbing material (Epolight1178™, Epoline) and 90 wt % of a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) mixed in chloroform on a $SiO_2$ substrate layer to form an about 500 nm-thick transparent polymer layer.

Evaluation III

A FDTD software is used to perform an optical simulation with respect to the optical filters according to Example 3 and Reference Examples 3-1 and 3-2.

Figure 13:
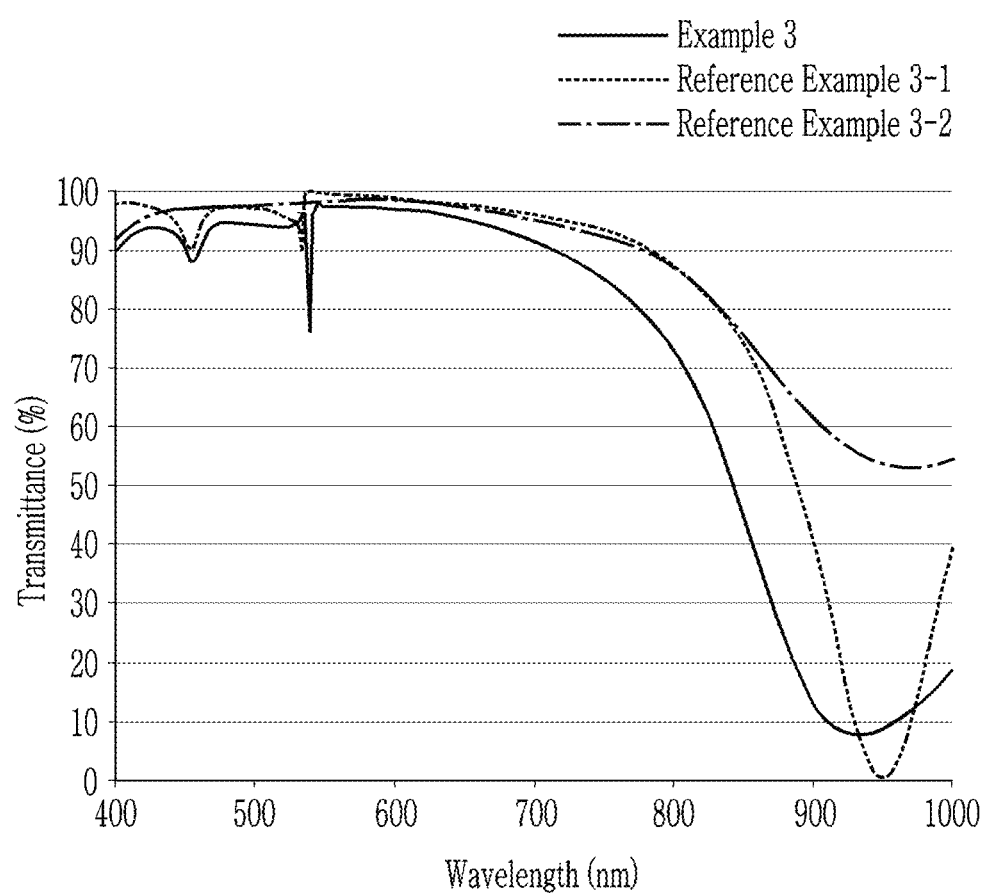
FIG. 13 is a graph showing transmission spectra of the optical filters according to Example 3 and Reference Examples 3-1 and 3-2.

The results are shown in Table 3 and FIG. 13.

FIG. 13 is a graph showing transmission spectra of the optical filters according to Example 3 and Reference Examples 3-1 and 3-2.

TABLE 3

| | $\lambda_{min, T}$ (nm) | $W_{50\%}$ (nm) | $R_{NIR}$ (%) | $T_{NIR}$ (%) | $T_{VIS}$ (%) | $T_{NIR}/T_{VIS}$ |
|---|---|---|---|---|---|---|
| Reference Example 3-1 | 950 | 100-120 | 72.4 | 18.0 | 96.5 | 0.19 |
| Reference Example 3-2 | 968 | — | 0.2 | 56.3 | 97.7 | 0.58 |
| Example 3 | 932 | >200 | 14.6 | 11.0 | 93.9 | 0.12 |

* $\lambda_{min, T}$: minimum transmission wavelength
* $W_{50\%}$: wavelength width at a transmittance of 50%
* $R_{NIR}$: average reflectance in a near-infrared (890 nm to 990 nm) wavelength spectrum
* $A_{NIR}$: average light absorption rate in a near-infrared (890 nm to 990 nm) wavelength spectrum
* $T_{NIR}$: average transmittance in a near-infrared (890 nm to 990 nm) wavelength spectrum
* $T_{VIS}$: average transmittance in a visible (430 nm to 565 nm) wavelength spectrum
* $T_{NIR} + R_{NIR} + A_{NIR} = 100$ (%)

Referring to Table 3 and FIG. 13, the optical filter according to Example 3 exhibits the lowest transmittance in the near-infrared wavelength spectrum and a wide wavelength width of the transmission spectrum compared with those of the optical filters according to Reference Examples 3-1 and 3-2.

In addition, the optical filter according to Example 3 exhibits a greatly decreased reflected light compared with that of the optical filter according to Reference Example 3-1, a greatly decreased ratio of the transmittance in the near-infrared wavelength spectrum relative to the transmittance in the visible wavelength spectrum compared with that of the optical filter according to Reference Example 3-2 and accordingly, may increase an effect of selectively blocking the near-infrared wavelength spectrum compared with the optical filters according to Reference Examples 3-1 and 3-2.

Design IV of Optical Filter

Example 4

An optical filter is designed by disposing a plurality of Ag nanodisks having a diameter of 160 nm and a thickness of 10 nm on a $SiO_2$ substrate layer with a surface coverage of 15% and then, spin-coating (3000 rpm, 20 seconds) a mixture of 15 wt % of a near-infrared absorbing material (Epolight 1178™, Epoline) and 85 wt % of a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) mixed in chloroform (a structure of FIGS. 1 and 2) to form an about 500 nm-thick light absorbing layer. The light absorbing layer exhibits an average refractive index (n) of 1.47 and a maximum extinction coefficient (k) of 0.16 in a wavelength spectrum of 900 nm to 1000 nm.

Reference Example 4-1

Without the near-infrared absorbing material, an optical filter is designed by disposing a plurality of Ag nanodisks having a diameter of 160 nm and a thickness of 10 nm on a $SiO_2$ substrate layer with a surface coverage rate of 15% and then, spin-coating (3000 rpm, 20 seconds) an cycloolefin polymer(poly[[octahydro-5-(methoxycarbonyl)-5-methyl-4,7-methano-1H-indene-1,3-diyl]-1,2-ethanediyl], Sigma-Aldrich, CAS No. 123322-60-1) solution thereon to form an about 500 nm-thick light absorbing layer.

Reference Example 4-2

Without the plurality of Ag nanodisks, an optical filter is designed to include by spin-coating (3000 rpm, 20 seconds)

a mixture of 15 wt % of a near-infrared absorbing material (Epolight1178™, Epoline) and 85 wt % of a cycloolefin polymer (poly[[octahydro-5-(methoxycarbonyl)-5-methyl-4,7-methano-1H-indene-1,3-diyl]-1,2-ethanediyl], Sigma-Aldrich, CAS No. 123322-60-1) mixed in chloroform on a $SiO_2$ substrate layer to form an about 500 nm-thick light absorbing layer.

Evaluation IV

A FDTD software is used to perform an optical simulation with respect to the optical filters according to Example 4 and Reference Examples 4-1 and 4-2.

Figure 14:
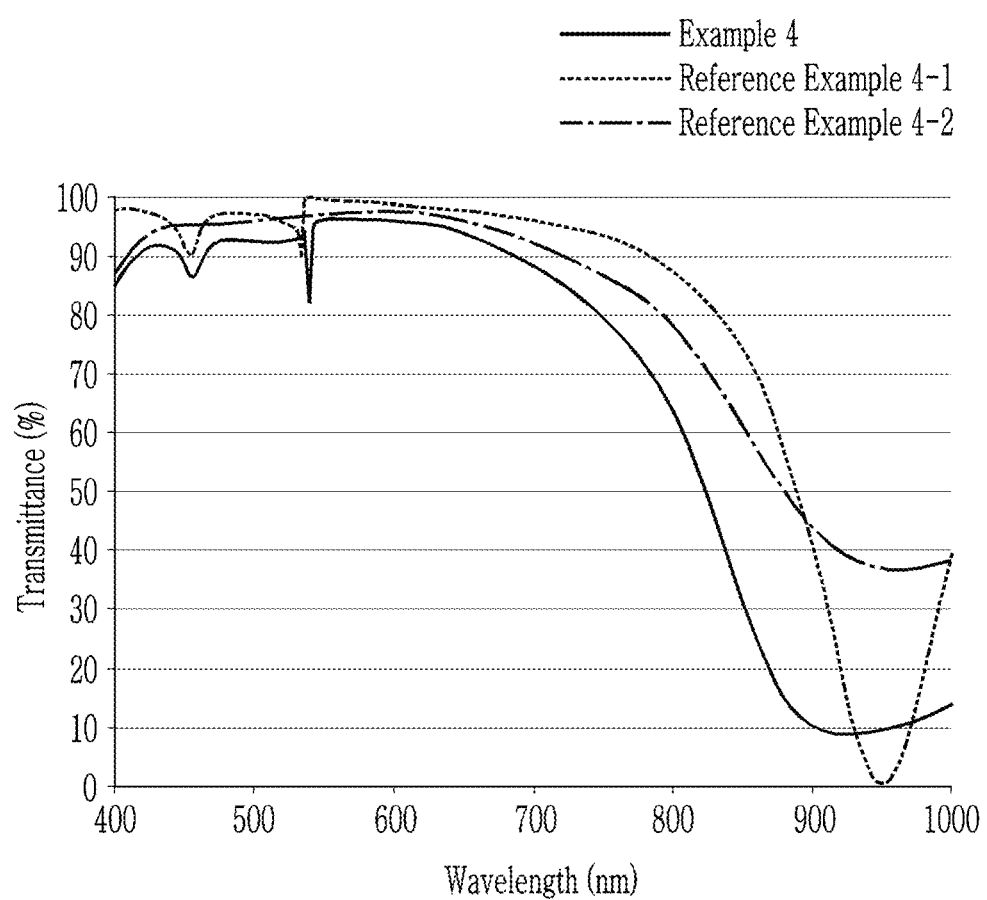
FIG. 14 is a graph showing transmission spectra of the optical filters according to Example 4 and Reference Examples 4-1 and 4-2.

The results are shown in Table 4 and FIG. 14.

FIG. 14 is a graph showing transmission spectra of the optical filters according to Example 4 and Reference Examples 4-1 and 4-2

TABLE 4

| | $\lambda_{min,\,T}$ (nm) | $W_{50\%}$ (nm) | $R_{NIR}$ (%) | $T_{NIR}$ (%) | $T_{VIS}$ (%) | $T_{NIR}/T_{VIS}$ |
|---|---|---|---|---|---|---|
| Reference Example 4-1 | 950 | 100-200 | 72.4 | 18.0 | 96.5 | 0.19 |
| Reference Example 4-2 | 962 | 200-250 | 0.5 | 39.1 | 96.0 | 0.41 |
| Example 4 | 926 | >300 | 4.0 | 10.1 | 92.2 | 0.11 |

* $\lambda_{min,\,T}$: minimum transmission wavelength
* $W_{50\%}$: wavelength width at a transmittance of 50%
* $R_{NIR}$: average reflectance in a near-infrared (890 nm to 990 nm) wavelength spectrum
* $A_{NIR}$: average light absorption rate in a near-infrared (890 nm to 990 nm) wavelength spectrum
* $T_{NIR}$: average transmittance in a near-infrared (890 nm to 990 nm) wavelength spectrum
* $T_{VIS}$: average transmittance in a visible (430 nm to 565 nm) wavelength spectrum
* $T_{NIR} + R_{NIR} + A_{NIR} = 100$ (%)

Referring to Table 4 and FIG. 14, the optical filter according to Example 4 exhibits the lowest transmittance of 10.1% in the near-infrared wavelength spectrum and the wide wavelength width of the transmission spectrum compared with the optical filters according to Reference Examples 4-1 and 4-2. In addition, the optical filter according to Example 4 exhibits a significantly lower ratio of the transmittance in the near-infrared wavelength spectrum relative to the transmittance in the visible wavelength spectrum compared with the optical filters according to Reference Examples 4-1 and 4-2. From this, the optical filter according to Example 4 may increase selective blocking effects for the near-infrared wavelength spectrum compared with the optical filters according to Reference Examples 4-1 and 4-2.

While this disclosure has been described in connection with what is presently considered to be practical example embodiments, it is to be understood that the inventive concepts is not limited to the disclosed example embodiments. On the contrary, it is intended to cover various modifications and equivalent arrangements included within the spirit and scope of the appended claims.

What is claimed is:

1. An optical filter, comprising:
a light absorbing layer including a near-infrared absorbing material configured to absorb light of a first wavelength spectrum, the first wavelength spectrum encompassed within a near-infrared wavelength spectrum; and
a conductive nanodisk configured to absorb, reflect, or scatter light of a second wavelength spectrum, the second wavelength spectrum at least partially overlapping the first wavelength spectrum such that the second wavelength spectrum at least partially overlaps the near-infrared wavelength spectrum.

2. The optical filter of claim 1, wherein the light absorbing layer is in contact with at least one of a lower surface, an upper surface, or a side surface of the conductive nanodisk.

3. The optical filter of claim 1, wherein the conductive nanodisk is a metal nanodisk, such that the conductive nanodisk includes a metal material.

4. The optical filter of claim 1, wherein a ratio of a diameter of the conductive nanodisk to a thickness of the conductive nanodisk is greater than or equal to about 8.

5. The optical filter of claim 1, wherein a diameter of the conductive nanodisk is about 80 nm to about 300 nm.

6. The optical filter of claim 5, wherein a thickness of the conductive nanodisk is about 1 nm to about 20 nm.

7. The optical filter of claim 1, wherein
a transmission spectrum of the near-infrared absorbing material has a first minimum transmission wavelength that is within the first wavelength spectrum,
a transmission spectrum of the conductive nanodisk has a second minimum transmission wavelength that is within the second wavelength spectrum, and
the first minimum transmission wavelength and the second minimum transmission wavelength are both within a wavelength spectrum of about 700 nm to about 990 nm.

8. The optical filter of claim 7, wherein a difference between the first minimum transmission wavelength and the second minimum transmission wavelength is less than or equal to about 100 nm.

9. The optical filter of claim 1, wherein a transmission spectrum of the optical filter overlaps both the first wavelength spectrum and the second wavelength spectrum and has a wavelength width that is wider than each of the first wavelength spectrum and the second wavelength spectrum.

10. The optical filter of claim 9, wherein the wavelength width of the transmission spectrum of the optical filter at 50% transmittance is greater than or equal to about 100 nm.

11. The optical filter of claim 1, wherein a ratio of an average transmittance of the optical filter in the near-infrared wavelength spectrum relative to an average transmittance of the optical filter in a visible wavelength spectrum is less than or equal to about 0.18.

12. The optical filter of claim 1, wherein
an average transmittance of the optical filter in a wavelength spectrum of about 430 nm to about 565 nm is greater than or equal to about 80%, and
an average transmittance of the optical filter in a wavelength spectrum of about 700 nm to about 800 nm or about 890 nm to about 990 nm is less than or equal to about 20%.

13. The optical filter of claim 12, wherein an average reflectance of the optical filter in the wavelength spectrum of about 700 nm to about 800 nm or about 890 nm to about 990 nm is less than or equal to about 30%.

14. The optical filter of claim 1, wherein a surface coverage of the conductive nanodisk is about 5% to about 50% of a total area of the optical filter.

15. The optical filter of claim 1, further comprising:
a binder or a cured product thereof,
wherein the conductive nanodisk is included in the optical filter in an amount of about 5 wt % to about 30 wt % based on a total weight of the conductive nanodisk, the near-infrared absorbing material, and the binder or the cured product thereof.

16. A camera comprising the optical filter of claim 1.

17. An electronic device comprising the camera of claim 16.

18. An image sensor, comprising:
a semiconductor substrate including a plurality of photodiodes, and
the optical filter of claim 1 on the semiconductor substrate.

19. The image sensor of claim 18, further comprising:
a color filter layer below or above the optical filter.

20. A camera comprising the image sensor of claim 18.

21. An electronic device comprising the camera of claim 20.

22. An optical filter, comprising:
a light absorbing layer including a light absorbing material configured to absorb light of a first wavelength spectrum; and
a conductive nanodisk configured to absorb, reflect, or scatter light of a second wavelength spectrum, the second wavelength spectrum at least partially overlapping the first wavelength spectrum.

23. The optical filter of claim 22, wherein the light absorbing layer includes a near-infrared absorbing material, and the first wavelength spectrum is encompassed within a near-infrared wavelength spectrum, such that the second wavelength spectrum at least partially overlaps the near-infrared wavelength spectrum.

24. The optical filter of claim 22, wherein the light absorbing layer is in contact with at least one of a lower surface, an upper surface, or a side surface of the conductive nanodisk.

25. The optical filter of claim 22, wherein the conductive nanodisk is a metal nanodisk, such that the conductive nanodisk includes a metal material.

26. The optical filter of claim 22, wherein a ratio of a diameter of the conductive nanodisk to a thickness of the conductive nanodisk is greater than or equal to about 8.

27. The optical filter of claim 22, wherein a diameter of the conductive nanodisk is about 80 nm to about 300 nm.

28. The optical filter of claim 27, wherein a thickness of the conductive nanodisk is about 1 nm to about 20 nm.

29. The optical filter of claim 22, wherein
a transmission spectrum of the light absorbing material has a first minimum transmission wavelength that is within the first wavelength spectrum,
a transmission spectrum of the conductive nanodisk has a second minimum transmission wavelength that is within the second wavelength spectrum, and
a difference between the first minimum transmission wavelength and the second minimum transmission wavelength is less than or equal to about 100 nm.

30. The optical filter of claim 22, wherein a transmission spectrum of the optical filter overlaps both the first wavelength spectrum and the second wavelength spectrum and has a wavelength width that is wider than each of the first wavelength spectrum and the second wavelength spectrum.

31. The optical filter of claim 30, wherein the wavelength width of the transmission spectrum of the optical filter at 50% transmittance is greater than or equal to about 100 nm.

* * * * *